United States Patent
Vellei

(10) Patent No.: US 9,263,552 B2
(45) Date of Patent: Feb. 16, 2016

(54) MOS-TRANSISTOR WITH SEPARATED ELECTRODES ARRANGED IN A TRENCH

(71) Applicant: Infineon Technologies AG, Neubiberg (DE)

(72) Inventor: Antonio Vellei, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/296,605

(22) Filed: Jun. 5, 2014

(65) Prior Publication Data

US 2015/0357437 A1 Dec. 10, 2015

(51) Int. Cl.
*H01L 29/66* (2006.01)
*H01L 29/40* (2006.01)
*H01L 29/423* (2006.01)

(52) U.S. Cl.
CPC ........ *H01L 29/66666* (2013.01); *H01L 29/401* (2013.01); *H01L 29/4236* (2013.01)

(58) Field of Classification Search
CPC .............. H01L 29/407; H01L 29/7397; H01L 29/66348; H01L 29/41741; H01L 29/402
USPC ............................ 257/329, 331, 341; 438/268
See application file for complete search history.

(56) References Cited

U.S. PATENT DOCUMENTS

| 5,326,711 A | 7/1994 | Malhi |
| 5,998,833 A | 12/1999 | Baliga |
| 6,815,769 B2 | 11/2004 | Pfirsch et al. |
| 8,748,976 B1 * | 6/2014 | Kocon et al. ................... 257/330 |
| 8,878,287 B1 * | 11/2014 | Moore ........................... 257/330 |
| 2003/0160270 A1 | 8/2003 | Pfirsch et al. |

FOREIGN PATENT DOCUMENTS

| DE | 19905421 A1 | 8/2000 |
| DE | 10038177 A1 | 2/2002 |
| DE | 10203164 A1 | 8/2003 |

\* cited by examiner

*Primary Examiner* — Evan Pert
*Assistant Examiner* — Changhyun Yi
(74) *Attorney, Agent, or Firm* — Murphy, Bilak & Homiller, PLLC

(57) ABSTRACT

A MOS transistor is produced by forming a first trench in a semiconductor body, forming a first isolation layer on inner surfaces of the first trench, and filling the first trench with conductive material to form a first electrode within the first trench. A portion of the first electrode is removed along one sidewall of the first trench to form a cavity located within the first trench. A second isolation layer is formed on inner surfaces of the cavity, and the cavity is at least partially filled with conductive material to form a second electrode within the cavity. A structured third isolation layer is formed on a top surface of the semiconductor body, and a metallization layer is formed on the structured third isolation layer. The first or the second electrode is electrically and thermally connected to the metallization layer via openings in the structured third isolation layer.

24 Claims, 9 Drawing Sheets

(a) (follows Fig. 2g)

(b)

(c) (proceed similar to Fig. 2k)

(a)
(follows Fig. 6c)

(b)

(c)

(d)
(proceed similar to Fig. 2m)

US 9,263,552 B2

MOS-TRANSISTOR WITH SEPARATED ELECTRODES ARRANGED IN A TRENCH

TECHNICAL FIELD

The present disclosure relates to the field of MOS transistors, in particular to a method for producing a MOS transistor having at least two separated gate electrodes arranged in one trench.

BACKGROUND

Robustness with regard to excessive temperatures is an important design goal for power semiconductor switches such as metal-oxide-semiconductor (MOS) field effect transistors (MOSFETs) insulated gate bipolar transistors (IGBTs). A robust design may be achieved, for example, by using specific materials and design rules when manufacturing the power semiconductor devices such that heat generated by energy dissipation is transferred away from the semiconductor device. Very high temperatures can particularly occur as a result of a short-circuit condition. The generated heat spreads throughout the semiconductor device in accordance with the heat conduction properties of the constituent materials. Various approaches exist which aim either at reducing the generation of heat within the active portions of the semiconductor switch or at improving the heat transfer out of the mentioned active portions to the outer surfaces of a semiconductor chip which may be coupled to a heat sink.

One approach to improve the robustness with regard to short circuits is to apply comparably thick metal layers (for example, copper layers) at the top and bottom surface of the semiconductor chip. The high thermal conductivity spreads the heat across the whole semiconductor chip surface and thus enables a proper cooling of the device. Thus, a thick metallization layer can be regarded as a kind of heat sink. However, a remaining problem impeding heat transfer out of the silicon is the thick interlayer oxides, which electrically isolate the metal (e.g., copper) layers from the surface of the semiconductor body. The interlayer oxides have significantly lower thermal conductivity than copper (or any other metal) and thus forms a bottle-neck in the heat conduction from the active portions of the semiconductor switch to the thermal sink.

SUMMARY

A method for producing a MOS transistor is disclosed. In accordance with one exemplary embodiment of the invention the method comprises providing a semiconductor body, forming a first trench in the semiconductor body, and forming a first isolation layer on inner surfaces of the first trench. The first trench is filled with conductive material to form a first electrode within the first trench. A portion of the first electrode is removed along one sidewall of the first trench to form a cavity in the first electrode, so that the cavity is located within the first trench. A second isolation layer is formed on inner surfaces of the cavity, and the cavity is at least partially filled with conductive material to form a second electrode within the cavity. A structured third isolation layer is formed on a top surface of the semiconductor body, and a metallization layer is formed on the structured third isolation layer. The first or the second electrode is electrically and thermally connected to the metallization layer via openings in the structured third isolation layer.

In accordance with another example of the invention, the method comprises providing a semiconductor body, forming a first trench in the semiconductor body, and forming a first isolation layer on inner surfaces of the first trench. The first trench is filled with conductive material to form a first electrode within the first trench. A second trench is formed in the semiconductor body directly adjoining the first trench, exposing a side surface of the first electrode or the first isolation layer. A second isolation layer is formed on inner surfaces of the second trench, and the second trench is at least partially filled with conductive material to form a second electrode within the second trench. A structured third isolation layer is formed on a top surface of the semiconductor body, and a metallization layer is formed on the structured third isolation layer. The first or the second electrode is electrically and thermally connected to the metallization layer via openings in the structured third isolation layer.

Those skilled in the art will recognize additional features and advantages upon reading the following detailed description and on viewing the accompanying drawings.

BRIEF DESCRIPTION OF THE DRAWINGS

The invention can be better understood with reference to the following drawings and descriptions which illustrate the embodiments of the present invention and aim to explain the principles of the invention. The components in the figures are not necessarily to scale; instead emphasis is placed upon illustrating the principles of the invention. Moreover, in the figures, like reference numerals designate corresponding parts. In the drawings.

DETAILED DESCRIPTION

In the following detailed description, reference is made to the accompanying drawings, which form a part hereof and in which are shown, by way of illustrations, specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "$n^-$" means a doping concentration which is lower than the doping concentration of an "n"-doping region while an "$n^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In general terms, an n-doped semiconductor region may be referred to as being of a first conduction type, whereas a p-doped semiconductor region may be referred to as being of a second conduction type.

Power semiconductor switches are usually implemented as vertical MOS transistors which are composed by a plurality of individual transistor cells which are electrically connected in parallel. A transistor is referred to as "vertical transistor" when its load current passes through the semiconductor die from a top surface to a bottom surface of the semiconductor die.

Figure 1:
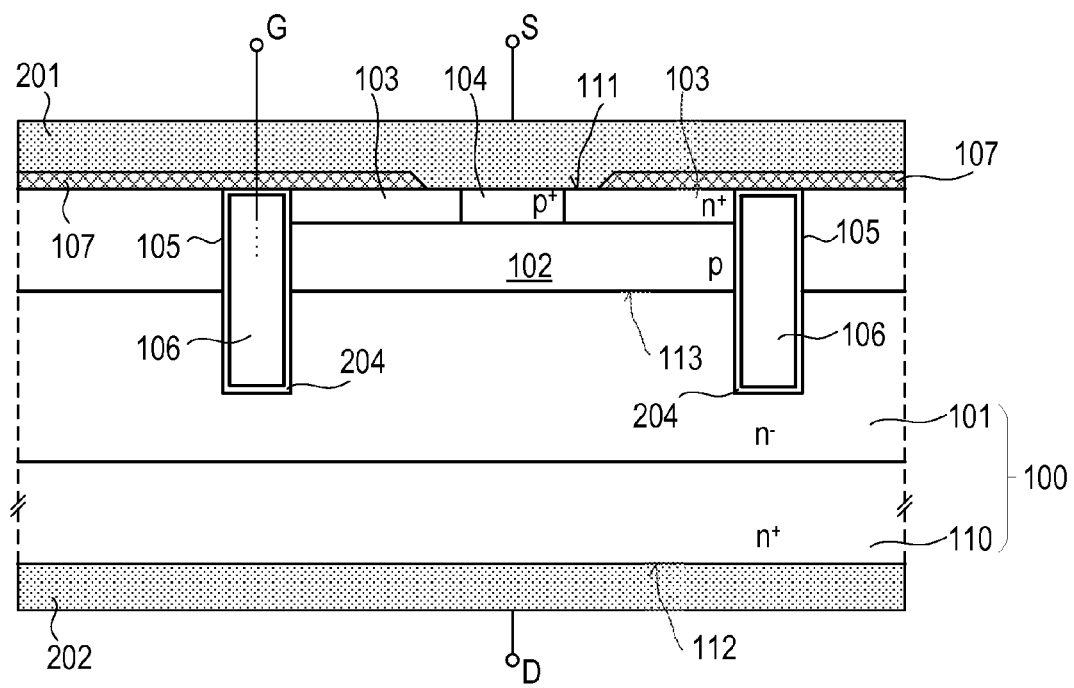
FIG. 1 schematically illustrates a lateral cross-sectional view of a common n-MOS transistor design comprising a plurality of gate electrodes arranged in trenches.

FIG. 1 illustrates, in a lateral cross-sectional view, the basic design of a vertical power MOS field effect transistor having trench gate electrodes 106 insulated from the surrounding semiconductor body 100 by a gate oxide 204. Only one transistor cell is shown in a cross sectional view in order to avoid unnecessary complication of the illustration. Furthermore, components that are not important for the present discussion have been omitted (e.g. the contacts between source and drain terminals S, D and the respective source and drain electrodes 201, 202.

In the present example, a p-doped body region 102 formed in an n-doped silicon body 100 is used to form an n-channel MOS transistor. It is understood that complementary doping can be used to form a p-channel MOS transistor. The silicon body 100 encompasses the silicon substrate 110 (e.g., a wafer) and all silicon layers deposited thereon (e.g., an epitaxial layer 101).

On top of the substrate 110, a silicon layer 101 is formed, e.g. by epitaxial growth. For this reason, the silicon layer 101 is usually referred to as epitaxial layer. The epitaxial layer has a comparably low concentration of dopants and thus its doping is referred to as "$n^-$". The substrate 110 together with the epitaxial layer 101 are often referred to as semiconductor body 100. The term "semiconductor body", however, is not to be confused with the term "body zone" (or "body region"), which refers to a specifically doped region within the semiconductor body. Trenches 105 are formed in the semiconductor body 100. In a vertical direction, the trenches 105 extend from the top surface 111 of the semiconductor body 100 into the epitaxial layer 101. In a horizontal (longitudinal or lateral) direction, the trenches may extend, for example, along a straight line or may be arranged to form a quadrangular or hexagonal structure. However, any other geometry may be used. The portions of the semiconductor body between trenches are referred to as transistor cells.

In each transistor cell a body zone 102 may be formed. In the present example, the body zone is p-doped; therefore the doping type is referred to as "p" in the figure. The body zone 102 may be produced using ion implantation or diffusion of suitable dopants and extends horizontally between two neighboring trenches 105 and substantially parallel to the top surface 111 of the semiconductor body 100. However, the body zones 102 do not extend so deep into the semiconductor body as the trenches 105. An active transistor cell further includes a source zone 103 adjoining each trench 105 and the top surface 111 of the semiconductor body 100. Thus, the source zones 103 are arranged between the p-doped area of the body zone 102 and the top surface of the semiconductor body. In the present example, the source zones 103 are heavily n-doped; therefore the doping type is referred to as "$n^+$" in the figure. A body contact zone 104, which is heavily doped and of the same conduction type as the body zone 102, may be arranged between the body zone 102 and the top surface 111 of the semiconductor body 100 in order to provide an ohmic electrical contact to the body zone 102. For this purpose, a metal layer 201 (e.g. copper, aluminum or any other conductive material such as Ti, TiN, W, TiW, AlCu, AlSiCu, NiSi, etc., and alloys or stacks thereof) is arranged on the top surface 111 as source electrode, which is electrically connected to the source zones 103 and the body contact zones 104 of a single or a plurality of transistors cells. The external source terminal S may be electrically connected to the source electrode, e.g. using bond wires. The electrical contact of the body zone 102 (via the body contact zone 104) may be implemented in a different manner in other embodiments. Furthermore, the body zone 102 is not necessarily electrically connected to the source electrode S as shown in the present example.

The substrate 110 forms the drain zone of the transistor cells. In case of an IGBT the substrate is p-doped and usually referred to as collector zone. A further metal layer 202 is arranged on the bottom surface 112 to provide an electrical contact between the substrate 100 and the drain terminal D (or collector terminal in case of an IGBT). Other types of semiconductor switches (e.g. reverse conducting IGBTs) may have a different design of the drain or collector.

The trenches 105 may be filled with doped polycrystalline silicon (or other conductive material such as metals or semiconductor material other than silicon) which forms the gate electrodes 106. Within the trenches 105, the gate electrodes 106 are isolated from the surrounding semiconductor material by an oxide layer 204 which is usually referred to as gate oxide. Furthermore, another oxide layer (interlayer oxide layer 107) is arranged between the gate electrodes 106 and the top metallization 201, which forms the source electrode, to insulate gate electrodes 106 from the source electrode.

When the voltage applied between gate electrode 106 and source electrode 201 is too low to activate the MOS channel of the transistor (vertically through the body zone 102 along the trench 105), a depletion layer (also: space charge region) builds up at the pn-junction 113 between the p-doped body zone 102 and the n-doped epitaxial layer 101, which is also referred to as drift zone in the field of power semiconductor devices. The depletion layer isolates drain from source and the transistor is non-conductive. When the voltage applied between gate electrode 106 and source electrode 201 is above a threshold voltage, charge carriers (electrons) can pass from the source zone 103 to the drain zone 110 (substrate) through a portion of the body zone 102 (close to the gate oxide) 204 referred to as inversion layer or n-channel (p-channel in case of p-channel MOSFETs or IGBTs).

The interlayer oxide layer 107 between the source metallization layer 201 (source electrode) and the semiconductor body 100 should be thick enough to prevent breakdown through the semiconductor body 100 during a blocking state of the transistor 1. For example, the thickness (in a vertical direction) of the oxide layer 107 may be 200 μm to 800 μm for a blocking voltage of about 1200 V. The oxide layer 107 may be made using any appropriate dielectric oxide like silicon oxide or aluminum oxide which have a high dielectric constant (also referred to as high-k oxides). The thermal resistance of the interlayer oxide 107 (which is, for silicon oxide, about one hundred times higher than the thermal resistance of silicon) protracts the heat transfer from the active transistor cells, in which energy is dissipated (which causes the generation of heat), to the metallization layer 201. Only a comparably small area 111, in which the metallization layer 201 directly contacts the semiconductor body 100 (particularly the source zones 103 and the body contact zone 104), is available for sinking heat from the semiconductor body 100 into the metallization 201.

In according with the embodiments described herein heat transfer from the active transistor cells to the metallization layer 201 is improved by providing at least two separate electrodes within the trenches or at least some of the trenches 105. A first one of the at least two electrodes operates as gate electrode similarly to a conventional transistor cell as illustrated in FIG. 1. A second one of the at least two electrodes is connected to the source electrode at a comparably large contact area at the top of a trench. For this purpose, openings in the interlayer oxide layer 107 are provided. One exemplary embodiment of a method for producing such a transistor is illustrated in FIGS. 2a to 2n.

FIG. 2a illustrates, in an exemplary lateral cross-sectional view, the portion of a semiconductor body 100 in which a trench 105 is to be produced. Only the epitaxial layer 101 is shown in order to keep the illustration simple. In should be emphasized, that the depicted geometry of the processed semiconductor component has to be regarded merely as an example which is not limiting with regard to the present invention. The steps for producing a transistor as illustrated in the FIGS. 2a-n need not necessarily be executed in the illustrated order. Furthermore, additional steps may be inserted in the shown sequence.

A hard mask 203 (usually an oxide mask) is produced on the top surface of the semiconductor body. The opening $O_{203}$ in the hard mask 203 defines the position of the trench to be produced. The trenches 105 are produced using an anisotropic etching process. The etching process is selective with regard to the silicon. That is, the etch rate at the hard mask is much lower (e.g. 100 times lower) than the etch rate at the silicon. FIG. 2b illustrates the trench 105 after the anisotropic etching. Subsequently, the hard mask 203 may be removed (this situation is depicted in FIG. 2c) and an oxide layer 204 is produced at the inner surfaces of the trench (i.e. the side walls and the bottom surface of the trench), e.g. using an appropriate heat treatment or any other process known in the field. Alternatively, the hard mask or a portion of the hard mask 203 may remain on the silicon surface. The resulting oxide layer 204 is illustrated in FIG. 2d and its thickness is labelled $t_2$. A specific desired oxide thickness $t_2$ can be achieved by appropriately setting the duration of the mentioned heat treatment (or by setting process parameters of whatever method is used for generating the oxide). The thickness $t_2$ of the oxide layer 204 may be constant or vary inside the trench 105 or on top of the epitaxial layer 101 depending on the process used for generating the oxide. To keep the drawing simple, however, the oxide is depicted with constant thickness. As shown in FIG. 2e the cavity defined by the trench 105 is filled with polycrystalline silicon (polysilicon) or any other electrically conductive material (e.g., metal) to form a first electrode 205 within the trench 105. In the present example chemical vapor deposition (CVD) may be used to deposit polysilicon in the trench 105. Excessive polysilicon is removed from the top surface of the semiconductor body, for example, using chemical etching and/or chemical-mechanical planarization (CMP) to obtain a flat surface. This situation is shown in FIG. 2f, wherein the trench 105 is filled with polysilicon forming a first electrode 205 up to the top surface of the semiconductor body. The polysilicon electrode 205 is isolated from the surrounding semiconductor material by the oxide layer 204. Alternatively, to the depicted example, the polysilicon 205 is not completely removed aside of the trench 105. A thin polysilicon layer may remain on top of the oxide layer 204 (see dotted line labelled 205' in FIG. 2f). This layer 205' may be structured to form electrical lines between different portions of the device.

A further hard mask 203' is applied to the planarized top surface of the semiconductor body as shown in FIG. 2g. The opening $O_{203}$' in the hard mask 203' should be located (in a vertical direction) above the trench (or at least above a portion of the trench) filled with the first electrode 205 and (in a horizontal direction) between the sidewalls of the trench 105. The alignment of the opening $O_{203}$' may be formed such that the hard mask 203' exposes only a portion of the first electrode 205 during the subsequent anisotropic etching as illustrated in FIG. 2g. In the illustrated example, the hard mask opening $O_{203}$' is aligned to one edge of the oxide 204. As illustrated in FIG. 2h, a portion of the first electrode 205 is removed by anisotropic etching, so that a small trench 105' (i.e. a cavity) is formed within the trench 105 and, in accordance with the current example, at one side of the trench 105. The first electrode is removed to a depth of $d_1$ from a top surface of the first electrode 205. In FIG. 2h, the remaining vertical dimension of the first electrode 205 below the small trench 105' is denoted as $d_{12}$. That is, the total depth of the trench 105 (including the thickness of the oxide on top of the epitaxial layer 101) is $d_1+d_{12}$. A further (isotropic) etching may be performed to (fully or partially) remove remaining oxide at the sidewall of the small trench 105' as shown in FIG. 2i. Furthermore, the hard mask 203' is (fully or partially) removed. Depending on the process used for forming the oxide 204 and the hard mask 203' the opening $O_{203}$ at the top of the small trench 105' may finally be slightly broader than it was before the mentioned oxide etching step. Such small variation in the breadth of the small trench 105' is neglected in the drawings for simplicity. As an alternative the small trench 105' may be formed besides the first trench 105 in the semiconductor body so that the trenches 105 and 105' directly adjoin each other (effectively forming a wider trench) or laterally overlap.

A further oxide layer 304 is produced by further heat treatment. The oxide layer 304 covers the sidewalls of the small trench 105' and part of the top surface of the semiconductor body. The oxide layer 304 is used as gate oxide and may be thinner than the oxide layer 204. As illustrated in FIG. 2i, one side wall of the small trench 105' adjoins the crystalline silicon of the epitaxial layer 101 whereas the opposing sidewall adjoins the polysilicon of the first electrode 205. As a result, the thickness of the oxide layer 304 depends on the oxide growth rate, which depends on the underlying material. In FIG. 2j the thickness of the oxide formed on the crystalline silicon (referred to as gate oxide) is labelled $t_1$ and the thickness of the oxide formed on the polysilicon of the first electrode 205 is labelled $t_{12}$ (inter-trench oxide). Subsequently, the small trench 105' is filled with electrode material (e.g. polysilicon) to form a second electrode 305 within the trench 105. Excessive oxide and polysilicon is again removed from the top surface, e.g. by chemical-mechanical planarization (CMP) in order to obtain a planar surface; this situation is illustrated in FIG. 2k.

Referring now to FIG. 2l, an interlayer oxide layer 107 (see also FIG. 1) is produced on the top surface of the semiconductor body, for example, by oxide deposition or any other suitable process. Openings are formed in the interlayer oxide layer 107, e.g. using photolithography and etching. Particularly, openings $O_{205}$ are formed in the portion of the oxide layer 107 above the first electrode 205 to allow an electrical and thermal contact of the first electrode 205. This situation is illustrated in FIG. 2m. Finally, a metallization layer 201 (cf. FIG. 1) is formed on the interlayer oxide layer 107 (see FIG. 2n). Amongst other materials (e.g., Al, AlCu, AlSiCu, W, TiW, TiN, etc.), pure copper may be used for producing the metallization layer 201, which is electrically connected to the source zones (see FIG. 1) of the transistor and also to the first electrode 205 arranged in the trench 105. Alternatively, the metallization layer 201 may be composed of a stack of sublayers of any of the mentioned or other suitable materials (Cu, Al, AlCu, AlSiCu, W, TiW, TiN, etc.) The second electrode 305 in the trench is connected to the gate potential and thus operates as gate electrode similar to a conventional MOS transistor as illustrated in FIG. 1.

The process described above allows individually setting the depths of the trenches, i.e. the dimensions $d_1$ and $d_{12}$ as well as setting the thicknesses $t_1$ and $t_2$ of the oxide layers 204 and 304. Therefore, the described method can easily adapted to the needs of the actual application.

Figure 2:
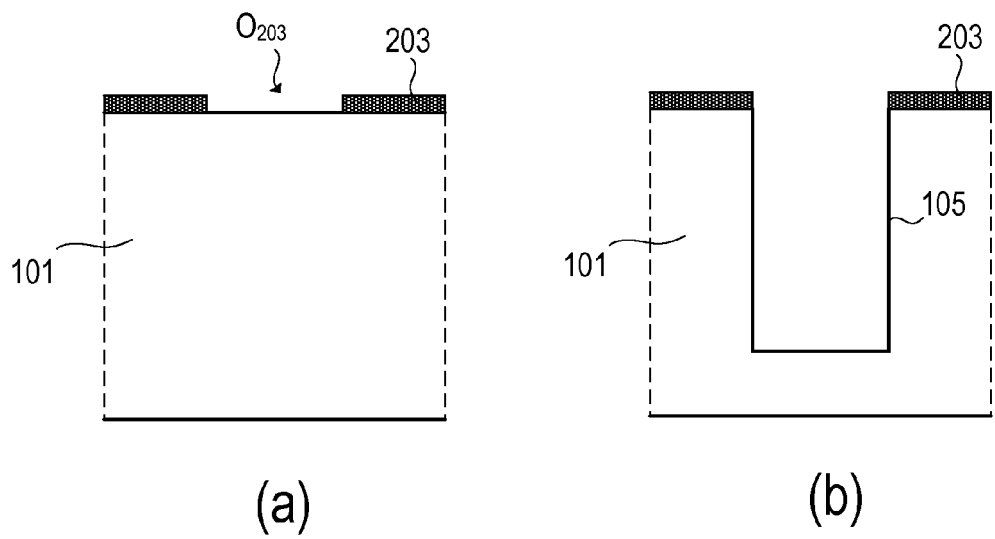
FIGS. 2(a) through 2(n) illustrate an exemplary sequence of steps of a method for producing a MOS transistor in accordance with one embodiment, wherein two separated electrodes are arranged in one trench.
Figure 2:
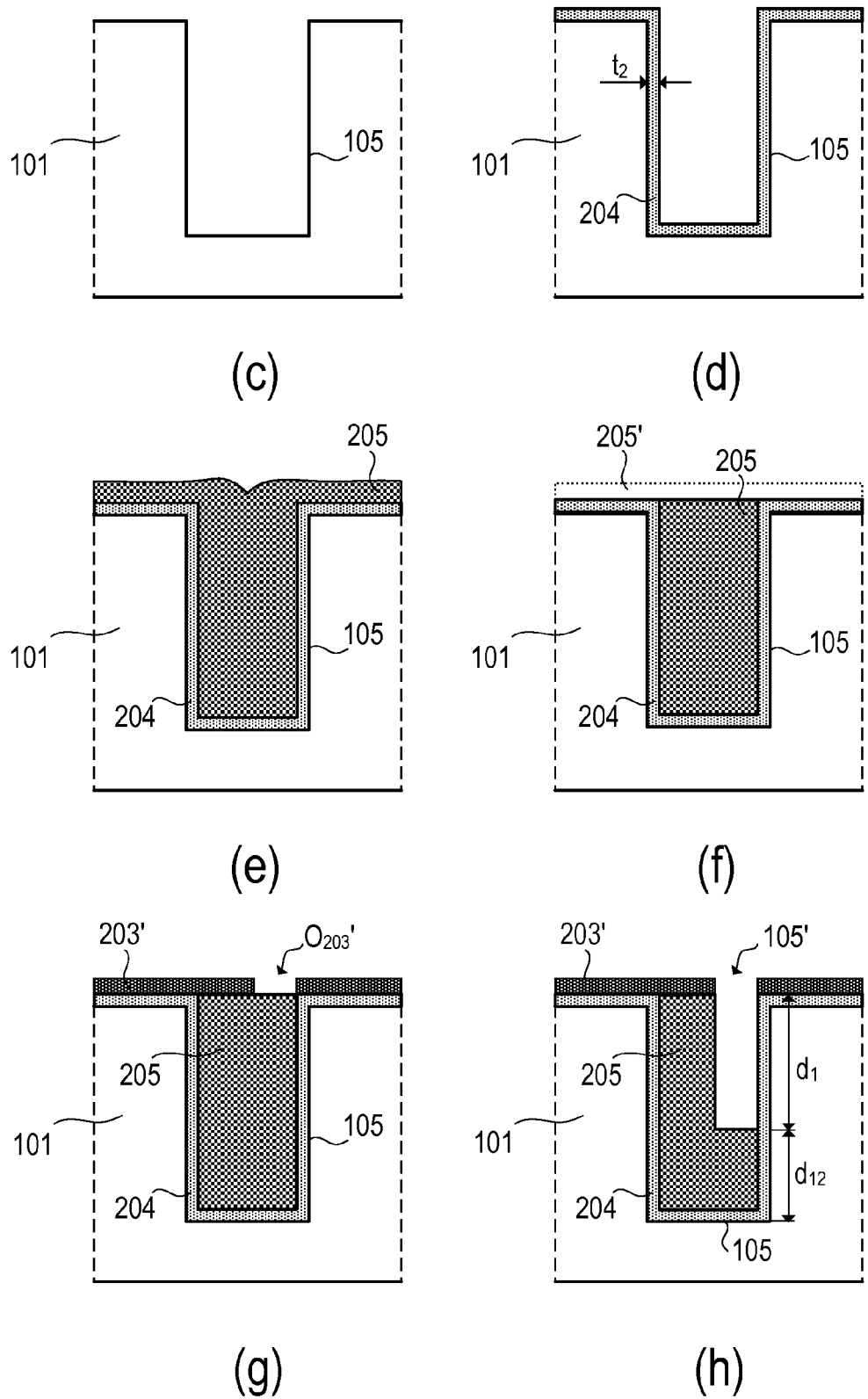
Figure 2:
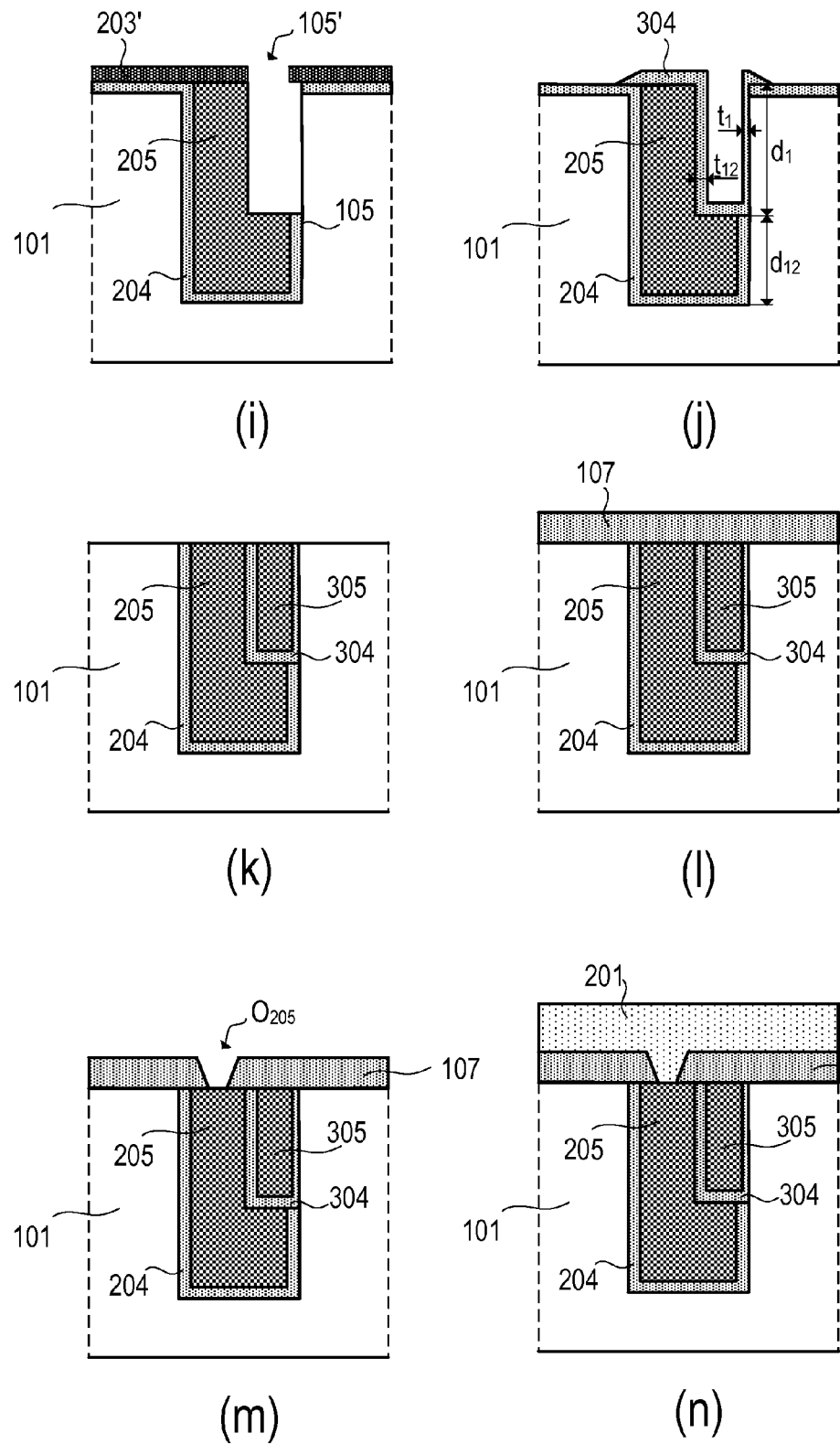
Figure 3:
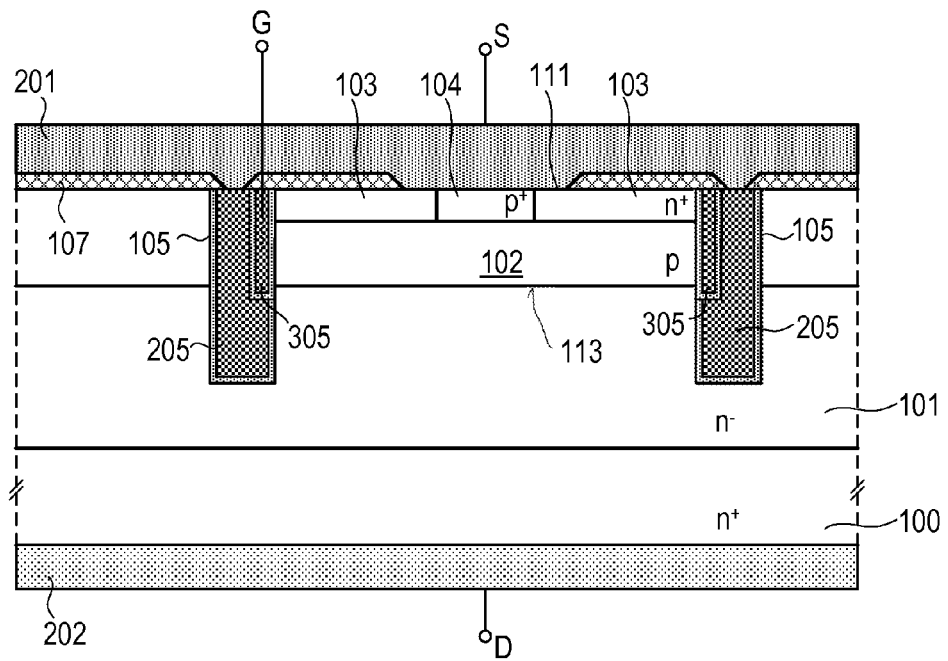
FIG. 3 illustrates one exemplary embodiment of a MOS transistor having two separated electrodes arranged in one trench.
Figure 4:
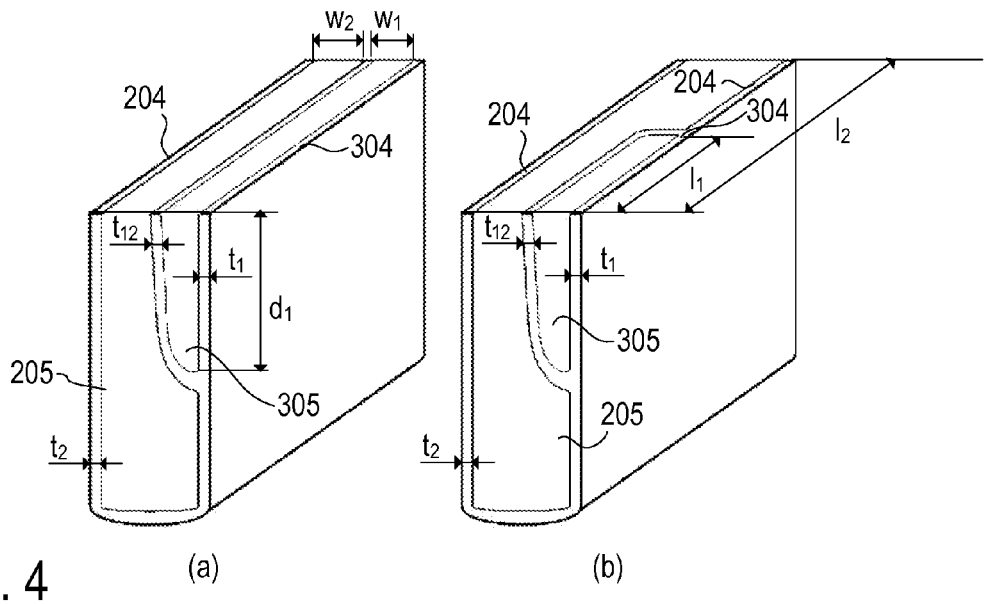
FIG. 4 illustrates isometric views of two different examples of electrodes arranged in one trench.

One exemplary MOS transistor produced using a method as described above with reference to FIGS. 2a-n is illustrated in FIG. 3. The example of FIG. 3 is identical with the general example of FIG. 1 except for the second gate electrode arranged in the trench 105. FIGS. 4a and 4b illustrate further examples of "split" trenches produced in accordance with the method discussed above with reference to FIG. 2. The example of FIG. 4a is an isometric view of the first and the second electrode 205 and 205', respectively, arranged in one trench. The dimensions $t_1$, $t_2$, $t_{12}$, and $d_1$ correspond to those in FIG. 2. The widths $w_1$ and $w_2$ of the two electrodes 205 and 305 depend on the lateral dimension of the openings $O_{203}$ and $O_{203}$' fabricated during processing (see FIG. 2a and FIGS. 2g-h). The total lateral width of the trench 105 in FIG. 4a is approximately $w_1+w_2$ plus the total oxide thickness $t_1+t_{12}+t_2$ wherein the width of the top surface of the first electrode 205 is $w_1$ and the width of the top surface of the second electrode 305 is $w_2$. These top surfaces are available to contact the metal layer 201 or the interlayer oxide 107 FIG. 4b illustrates a similar example. However, the second electrode 205' extends (in a longitudinal direction) only along a limited length $l_1$ wherein the length of the first electrode 205 is $l_2$.

Figure 5:
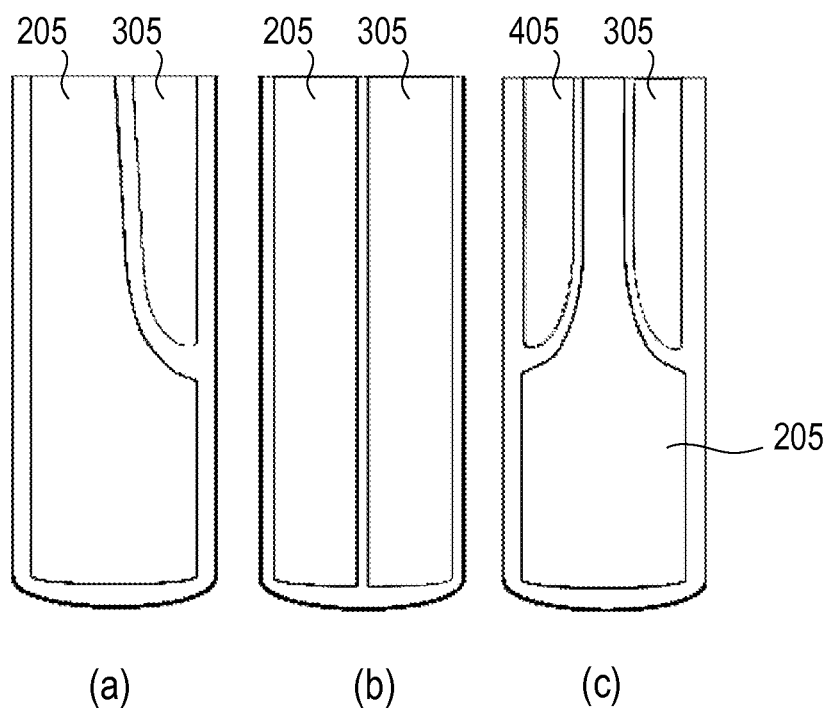
FIGS. 5(a) through 5(c) schematically illustrate lateral cross-sectional views of three different examples with two or three electrodes arranged in one trench.

FIGS. 5a-c illustrate further exemplary embodiments of electrodes arranged in a trench. The example of FIG. 5a is a sectional view corresponding to the example of FIG. 4a. In the example of FIG. 5b, both electrodes 205, 305 vertically extend to the same maximum depths of the trench 105 In that case $d_{12}$ (cf. FIG. 2j) corresponds to the oxide thickness $t_2$ at the bottom of the trench 105. Such structure can be obtained, referring to FIG. 2g, by etching the opened electrode 205 down to the bottom of the electrode 205, i.e. until the oxide 204 is reached. Such example of the process will be discussed later with reference to FIG. 6. In the example of FIG. 5c a three electrodes 205, 305, 405 are arranged in one trench. Thereby, the outer electrodes 305 and 405 may be produced simultaneously in the same step of the manufacturing process. In this case, the electrodes 305 and 405 can be connected to the same potential level (i.e. gate potential). Nevertheless, with the addition of an inter-metal insulating layer between the metal contact layer of the electrode 305 and 405, the electrodes 305 and 405 could also be connected to different potentials.

Contacting one electrode in the trench (i.e. the first electrode 205) to the source metallization 201 (see, e.g., FIG. 2n and FIG. 3) significantly reduces the thermal resistance resulting from the comparably low thermal conductivity of the thick (e.g. up to 600 μm) interlayer oxide layer 107. The contact area between the source metallization 201 and the first electrode 205 may extend along the trench for a comparably long distance. Therefore, the surface available for the transferal of heat from the silicon 101 to the thermal sink 201 will be increased from the contact area 111 (see FIG. 1) with negligible thermal resistivity, to the whole trench 105 interface in contact with the interlayer oxide 107.

Figure 6:
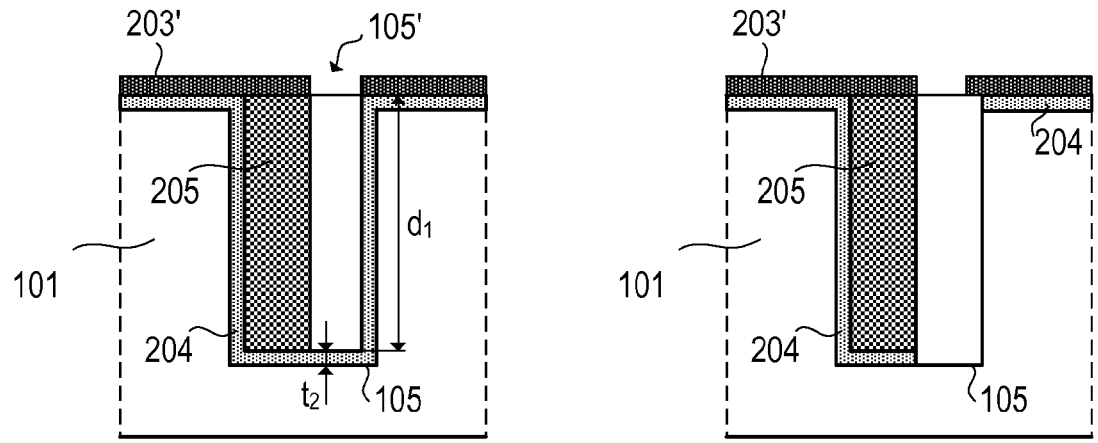
FIGS. 6(a) through 6(c) illustrate an example of a first alternative to the process shown in FIG. 2.
Figure 6:
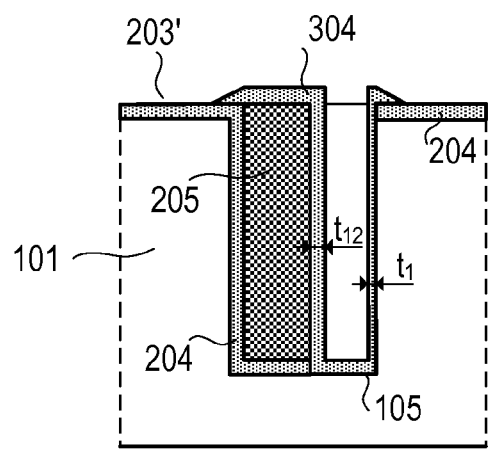

FIG. 6 illustrates an alternative example to the process illustrated in FIG. 2. The step shown in FIG. 6a follows the step of FIG. 2g. Different from the example of FIG. 2h, the small trench 105' (cavity) is etched down to the oxide 204 at the bottom of the trench 105. In accordance with FIG. 6b the remaining oxide at the side walls of the small trench 105' is removed. Furthermore, the hard mask 203' may be removed. Alternatively, the hard mask 203' may be only partially removed or remain on the surface of the oxide layer 204. In accordance with FIG. 6c an oxide layer 304 is generated as already shown in FIG. 2j. The remaining process may be continued analogously to the steps illustrated in FIGS. 2k to 2n.

Figure 7:
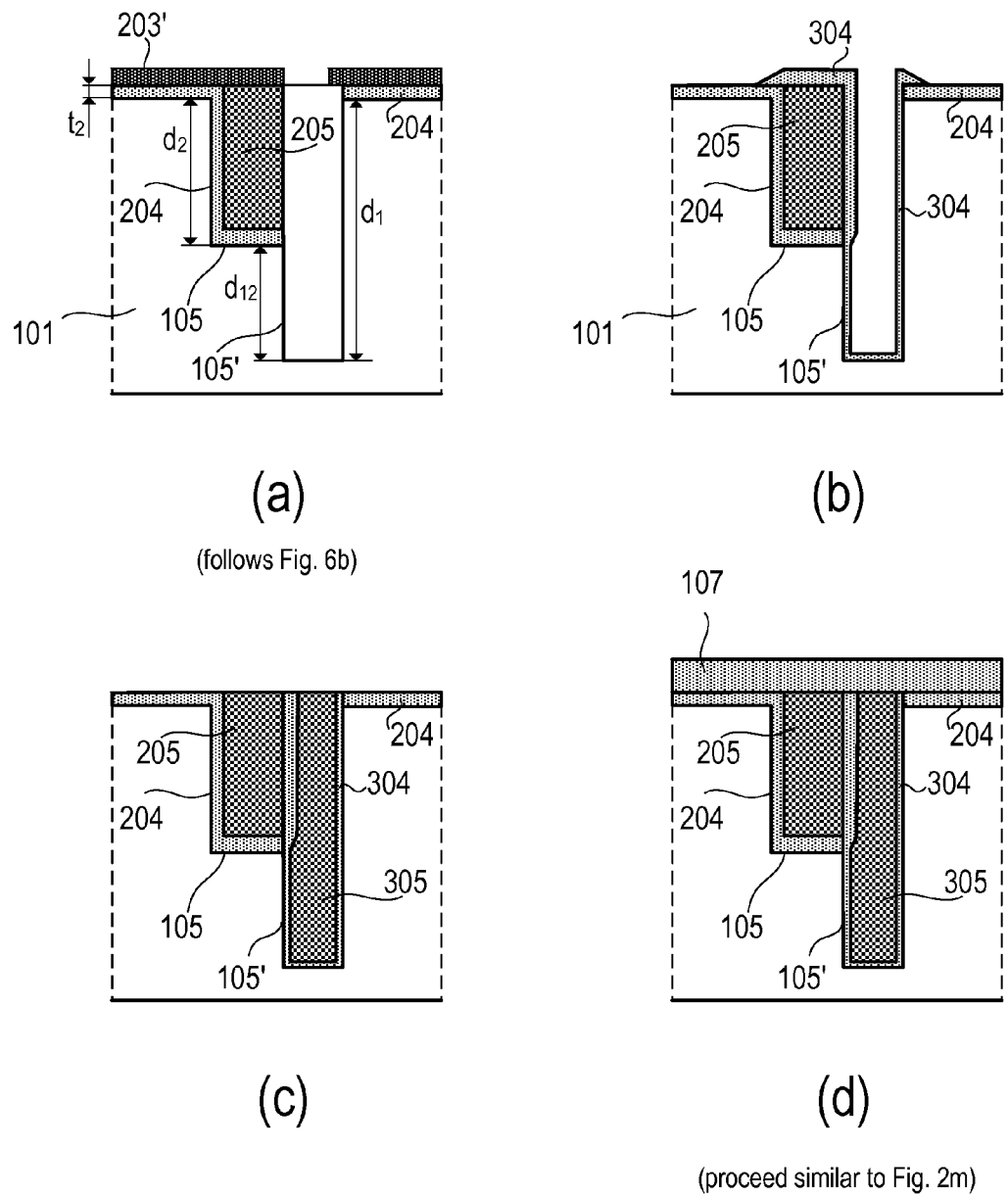
FIGS. 7(a) through 7(d) illustrate an example of a second alternative to the process shown in FIG. 2.

FIG. 7 illustrates an alternative example to the process illustrated in FIGS. 2 and 6. The step illustrated in FIG. 7a follows the step shown in FIG. 6a (or FIG. 6b or FIG. 2h), wherein, however, the small trench 105' is etched even deeper than the "large" trench 105. In accordance with FIG. 7b the hard mask 203' has been removed and the oxide layer 304 has been formed as in FIG. 6c. According to FIG. 7c the small trench 105' has been filled with electrode material (e.g. polysilicon) and the portion of the oxide 304 on the top of the semiconductor body has been removed. FIG. 7d illustrates the interlayer oxide 107 formed in the next step. The remaining process may be continued analogously to the steps illustrated in FIGS. 2m and 2n.

Figure 8:
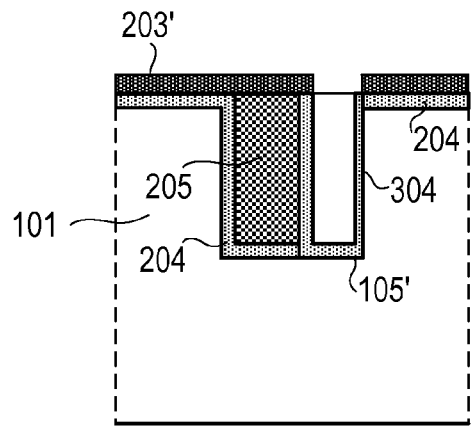
FIGS. 8(a) through 8(d) illustrate an example of a third alternative to the process shown in FIG. 2.
Figure 8:
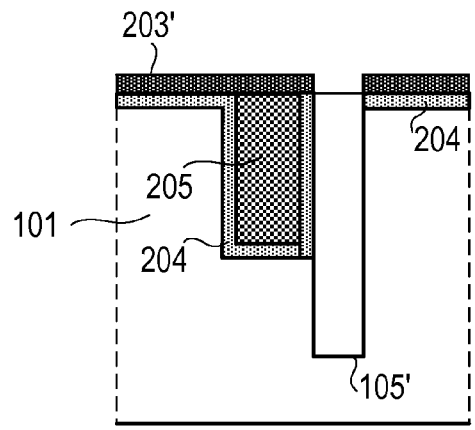
Figure 8:
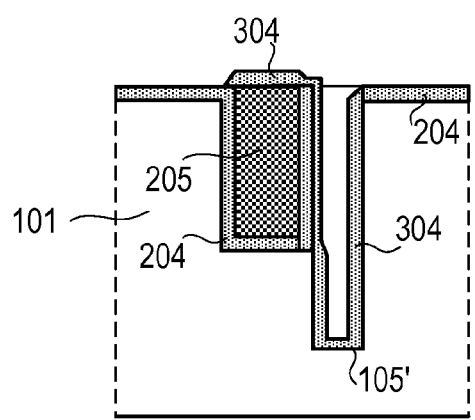
Figure 8:
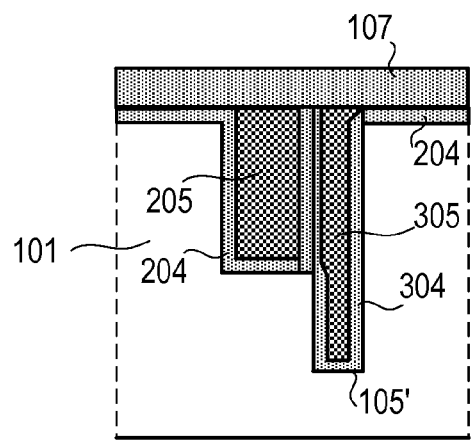

FIG. 8 illustrates a further alternative to the example of FIG. 6 or 7, wherein FIG. 8a may follow FIG. 6c. Basically, the examples of FIGS. 7 and 8 differ in that the hard mask 203' is aligned such that the portion of the oxide 304 on the first electrode 205 is not removed by the following etching step (FIG. 8b) in which the small trench 105' is etched below the bottom of the large trench 105 similar to the previous example of FIG. 7. The following FIG. 8c essentially corresponds to FIG. 7b, where the oxide layer 304 is again formed on the walls of the small trench 105' (which is now deeper than in FIG. 8a). However, the growth rate of new oxide on the existing oxide is different from the growth rate of oxide on a silicon surface. As mentioned above, the growth rate depends on the underlying material. FIG. 8d illustrates the trench electrodes covered with the interlayer oxide 107. The remaining process may be continued analogously to the steps illustrated in FIGS. 2m and 2n. In essence, products fabricated in accordance with FIG. 7 and FIG. 8 differ in the thicknesses of the oxide surrounding the second electrode 305 in the small trench 105'.

Figure 9:
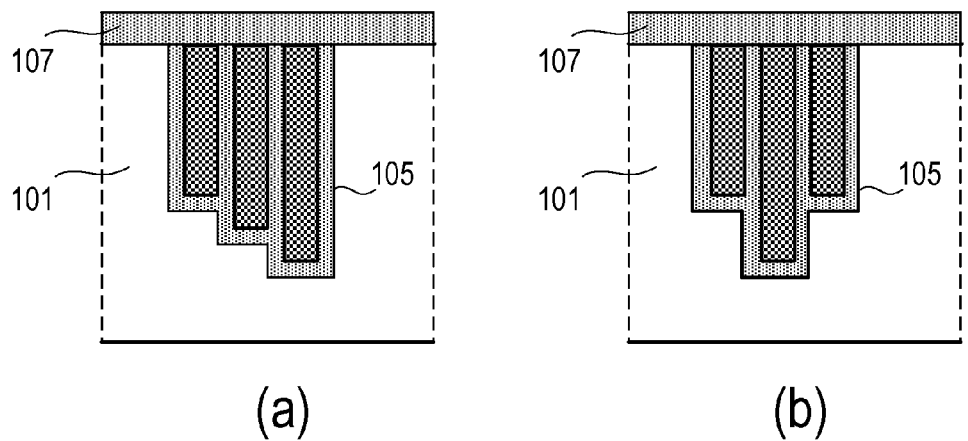
FIGS. 9(a) and 9(b) schematically illustrate lateral cross-sectional views of three different examples with three electrodes arranged in one trench.

FIGS. 9 (9a and 9b) illustrates further examples with three electrodes of different vertical dimension arranged in a trench. These examples can be regarded as an alternative to the example of FIG. 5c.

Figure 10:
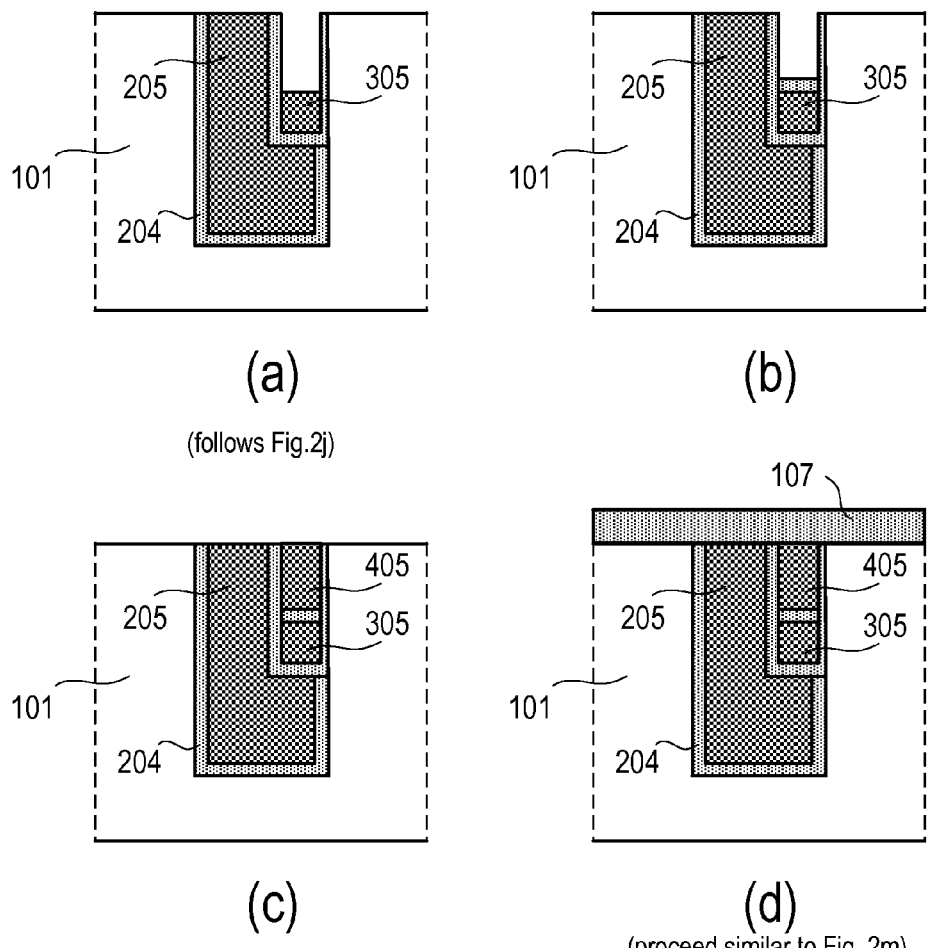
FIGS. 10(a) through 10(d) illustrate an example with two electrodes arranged in one trench, one electrode being buried in the other electrode.

FIG. 10 illustrates a further alternative to the example of FIG. 2 in which the second electrode 305 is buried under a further electrode 405. FIG. 10a may follow FIG. 2j. According to FIG. 10 a (and different from FIG. 2k) the small trench 105' is only partially filled with the electrode material (e.g. polysilicon) to form the second electrode 305. Then (FIG. 10b) the second electrode 305 is covered by an oxide layer, and subsequently (FIG. 10c) the small trench is further filled with electrode material forming a third electrode 405. In FIG. 10d the resulting structure is covered with the interlayer oxide layer 107, and the remaining process may be continued analogously to the steps illustrated in FIGS. 2m and 2n.

A person skilled in the art will understand that the embodiments described herein may include additional steps which are as such known and have been not described for the sake of simplicity and clarity of the description. From the above description of the present invention, those skilled in the art may perceive improvements, modifications and changes. Such improvements, modifications, and changes within the skill of the art are intended to be covered by the claims appended hereto.

What is claimed is:

1. A method for producing a trench transistor, the method comprising:
    providing a semiconductor body;
    forming a first trench in the semiconductor body, the first trench comprising two side walls and a bottom surface;
    forming a first isolation layer on inner surfaces of the first trench;
    filling the first trench with conductive material to form a first electrode within the first trench;
    removing a portion of the first electrode along one of the side walls of the first trench to form a cavity in the first electrode, the cavity being located within the first trench;
    forming a second isolation layer on inner surfaces of the cavity;
    at least partially filling the cavity with conductive material to form a second electrode within the cavity;
    forming a structured third isolation layer on a top surface of the semiconductor body; and
    forming a metallization layer on the structured third isolation layer, wherein the first or the second electrode is electrically and thermally connected to the metallization layer via openings in the structured third isolation layer.

2. The method of claim 1, further comprising:
    forming a body zone in the semiconductor body, the body zone adjoining a side wall of the first trench; and
    forming a source zone in the semiconductor body, the source zone adjoining a top surface of the semiconductor body and the side wall of the first trench.

3. The method of claim 2, wherein the source zone is electrically coupled to the metallization layer via openings in the structured third isolation layer.

4. The method of claim 1, wherein a side wall of the cavity is substantially vertical and coplanar with a corresponding side wall of the first trench.

5. The method of claim 1, wherein a horizontal width of the cavity is less than a horizontal width of the first trench.

6. The method of claim 5, wherein a vertical depth of the cavity is less or equal then a depth of the first trench, the vertical depth of the cavity being measured between a top surface of the first electrode and a bottom side of the cavity.

7. The method of claim 5, wherein a vertical depth of the cavity is greater than a depth of the first trench, the vertical depth of the cavity being measured between a top surface of the first electrode and a bottom side of the cavity.

8. The method of claim 1, wherein at least one of the first, the second and the third isolation layers is an oxide layer.

9. The method of claim 1, wherein the cavity is only partially filled with the conductive material to form the second electrode within the cavity, and a third electrode is formed in the cavity vertically above the second electrode and isolated from the second electrode.

10. The method of claim 1, further comprising:
    removing a further portion of the first electrode to form a further cavity in the first electrode, the further cavity being located within the first trench;
    forming an further isolation layer on inner surfaces of the further cavity; and
    at least partially filling the further cavity with conductive material to form a further electrode within the further cavity.

11. The method of claim 1, wherein the first trench and the cavity are formed using photolithography and etching.

12. The method of claim 1, wherein the first, second and third isolation layers are each formed by thermal oxide generation and/or oxide deposition.

13. The method of claim 1, wherein the second isolation layer lines each of the inner surfaces of the cavity when the cavity is at least partially filled with conductive material such that the second electrode is completely electrically insulated from the semiconductor body by the second isolation layer.

14. A method for producing a trench transistor, the method comprising:
    providing a semiconductor body;
    forming a first trench in the semiconductor body;
    forming a first isolation layer on inner surfaces of the first trench;
    filling the first trench with conductive material to form a first electrode within the first trench;
    forming a second trench in the semiconductor body directly adjoining the first trench, wherein forming the second trench comprises exposing a side surface of the first electrode or the first isolation layer, the side surface of the first electrode or the first isolation layer extending between a main lateral surface of the semiconductor body and a bottom of the first trench;
    forming a second isolation layer on inner surfaces of the second trench;
    at least partially filling second trench with conductive material to form a second electrode within the second trench;
    forming a structured third isolation layer on a top surface of the semiconductor body; and
    forming a metallization layer on the structured third isolation layer, wherein the first or the second electrode is electrically and thermally connected to the metallization layer via openings in the structured third isolation layer.

15. The method of claim 14, further comprising:
    forming a body zone in the semiconductor body, the body zone adjoining a side wall of the first trench; and forming a source zone in the semiconductor body, the source zone adjoining a top surface of the semiconductor body and the side wall of the first trench.

16. The method of claim 15, wherein the source zone is electrically coupled to the metallization layer via openings in the structured third isolation layer.

17. The method of claim 14, wherein a side wall of the second trench is substantially vertical and aligned with an adjoining side wall of the first trench.

18. The method of claim 14, wherein the first and the second trenches overlap in a lateral direction.

19. The method of claim 14, wherein a horizontal width of the second trench is less than or equal to a horizontal width of the first trench.

20. The method of claim 14, wherein a vertical depth of the second trench is less than or equal to a depth of the first trench, the vertical depth of the second trench being measured between a top surface of the first electrode and a bottom side of the second trench.

21. The method of claim 14, wherein a vertical depth of the second trench is greater than a depth of the first trench, the vertical depth of the second trench being measured between a top surface of the first electrode and a bottom side of the second trench.

22. The method of claim 14, wherein the first and the second trenches are formed using photolithography and etching.

23. The method of claim 14, wherein the first, second and third isolation layers are each formed by thermal oxide generation and/or oxide deposition.

24. The method of claim 14, wherein the second isolation layer lines each of the inner surfaces of the second trench when the second trench is at least partially filled with conductive material such that the second electrode is completely electrically insulated from the semiconductor body by the second isolation layer.

* * * * *

UNITED STATES PATENT AND TRADEMARK OFFICE
CERTIFICATE OF CORRECTION

| | | |
|---|---|---|
| PATENT NO. | : 9,263,552 B2 | Page 1 of 1 |
| APPLICATION NO. | : 14/296605 | |
| DATED | : February 16, 2016 | |
| INVENTOR(S) | : Antonio Vellei | |

It is certified that error appears in the above-identified patent and that said Letters Patent is hereby corrected as shown below:

In the claims,
Column 10, line 23 (claim 10 line 5), please change "forming an further" to -- forming a further --

Signed and Sealed this
Twenty-fourth Day of May, 2016

Michelle K. Lee
*Director of the United States Patent and Trademark Office*